United States Patent [19]
Phillips

[11] Patent Number: 4,665,360
[45] Date of Patent: May 12, 1987

[54] DOCKING APPARATUS
[75] Inventor: Edward H. Phillips, Middletown, Calif.
[73] Assignee: Eaton Corporation, Cleveland, Ohio
[21] Appl. No.: 710,743
[22] Filed: Mar. 11, 1985
[51] Int. Cl.[4] .................. G01R 1/04; G01R 31/02; G01R 15/12
[52] U.S. Cl. ..................... 324/158 F; 324/158 P; 324/72.5; 324/73 PC
[58] Field of Search ............... 324/158 F, 158 P, 72.5, 324/73 PC

[56] References Cited
U.S. PATENT DOCUMENTS
4,518,914 5/1985 Okubo et al. .............. 324/158 P Primary Examiner—Reinhard J. Eisenzopf
Assistant Examiner—Vinh P. Nguyen
Attorney, Agent, or Firm—D. A. Rowe; F. M. Sajovec

[57] ABSTRACT

Docking apparatus for a semiconductor wafer prober (16). A cylindrical housing assembly provides an electrical interface between pads on the wafer (22) and contacts on the load board (76) of a test head (12) through a contact ring (74). The housing assembly is in two parts with a first part (29) clamped to a frame portion (30) of the prober and a second part (58) supported above the first part by compression springs (64). Limited angular movement is provided between the housing assembly and the prober frame. The separation between the housing members is maintained so that the force exerted on the contact ring in the docking process is determined by the compression of the springs.

8 Claims, 3 Drawing Figures

DOCKING APPARATUS

The present invention relates generally to apparatus for testing semiconductor wafers, and more particularly to docking apparatus for a wafer probing system. In a wafer prober, a wafer is positioned on a chuck, and then precisely aligned so that each die is accurately positioned under a set of test probes which make physical contact with the contact pads located around the edge of each die. The die is then exercised by a tester which has been configured to the particular die under test. Defective die are marked, and their positions are stored for future processing. The prober sequentially steps and places each die under the probes until the entire wafer has been tested.

The electronic test equipment which is used to exercise and perform the required test procedures on the wafers is connected to the prober through a test head which is electrically connected to the tester and is engageable with an interface assembly on the prober. The test probes are connected to a P.C. board on a lower end of the interface assembly which is wired to a second P.C. board on an upper end of the assembly. Electrical contact between a load board on the test head and the P.C. board on the interface assembly is through a contact ring which includes a plurality of pads or buttons which are impregnated with a conducting material, and are commonly known as "fuzz buttons".

The process by which the test head is brought into electrical contact with the prober is called "docking". In accordance with the prior art the test head is guided into position on a rigid support plate on the prober to put the load performance board on the test head a predetermined distance above the upper interface board on the prober, with the fuzz buttons compressed between the load performance board and the interface board. In theory, the fuzz buttons are compressed an optimum amount which provides good electrical contact between the fuzz buttons and the corresponding contacts on the load performance board and the interface board. In practice, however, there can be considerable variation in the flatness of the load and interface boards, wear, and other factors, resulting in uneven loading of the fuzz buttons, which in turn can result in loss of electrical contact across some fuzz buttons, and excessive compression of others. Since there can be over a hundred fuzz buttons on some contact rings, excessive compression can cause shorting between adjacent buttons.

In accordance with the present invention, the interface assembly is formed of two parts, including a mounting sleeve on which the probes are mounted and a spring-loaded plate interposed between the test head and the mounting sleeve, such that when the test head is brought into contact with the upper interface board the springs compress, thus providing a predetermined compression force on the fuzz buttons, which force is substantially uniform across the buttons. The spring-loaded plate never bottoms out against the mounting sleeve so that the compression force against the fuzz buttons is always determined by the compression of the springs.

In accordance with another aspect of the invention, the mounting sleeve is configured to facilitate and to improve the accuracy of the X, Y and O adjustments of the mounting sleeve.

Other objects and advantages of the invention will be apparent from the following description when taken in connection with the accompanying drawings, wherein.

Figure 1:
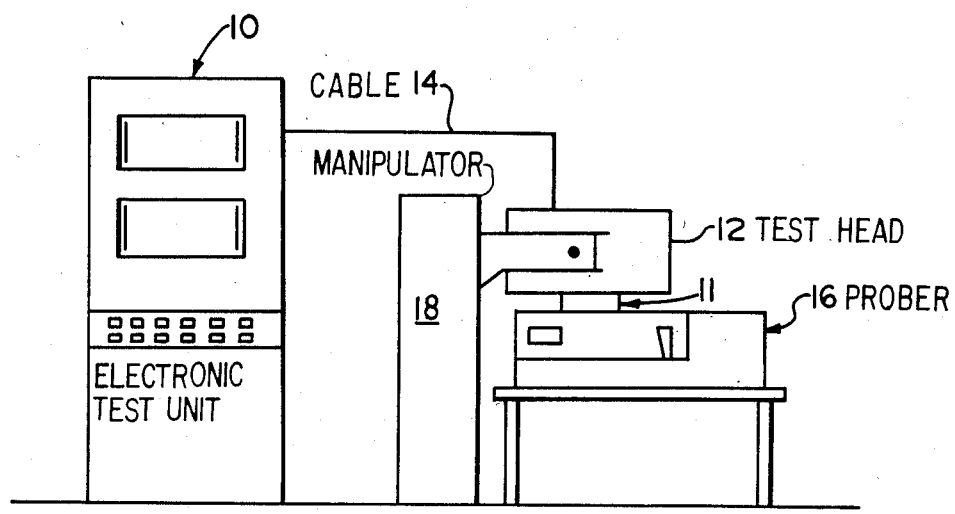
FIG. 1 is a schematic view of a test system incorporating an automatic prober.

Referring to FIG. 1, there is schematically illustrated a semiconductor wafer test system comprising an electronic test unit 10, a test head 12 connected to the tester by means of a cable 14, an automatic wafer prober 16, and a manipulator 18 on which the test head is mounted, and which is operable to move the test head into and out of electrical contact with a wafer positioned on the prober.

In a known manner, the prober is operable to precisely position each die on the wafer in position for the contact pads on the die to be contacted by the test probes. The test head serves as an interface between the prober 16 and the tester 10 and includes certain test circuitry which, in combination with circuitry in the tester applies test signals to each die.

The present invention is directed specifically to an interface assembly, designated generally by the numeral 11, which serves as the interface between the test head and the prober.

Figure 3:
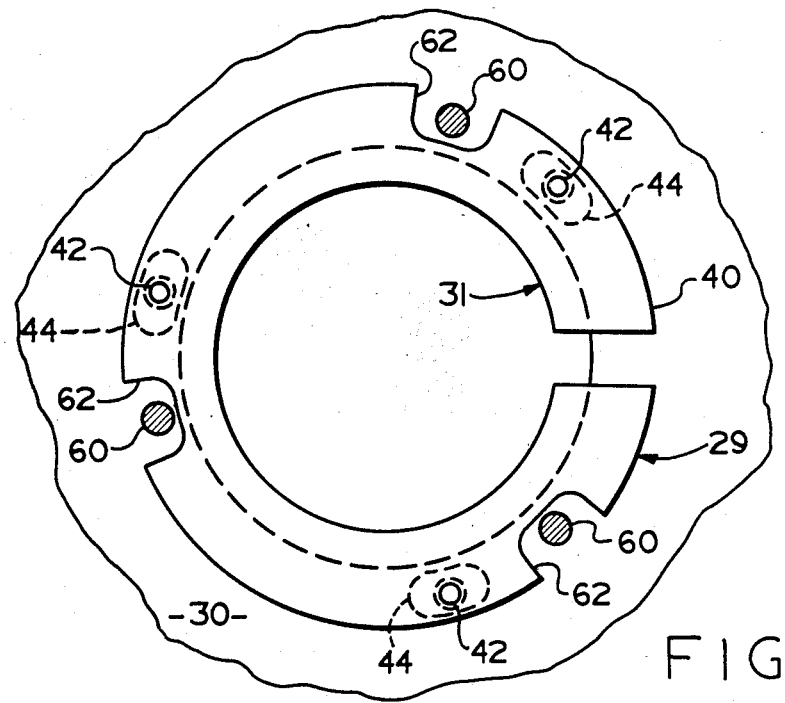
Figure 2:
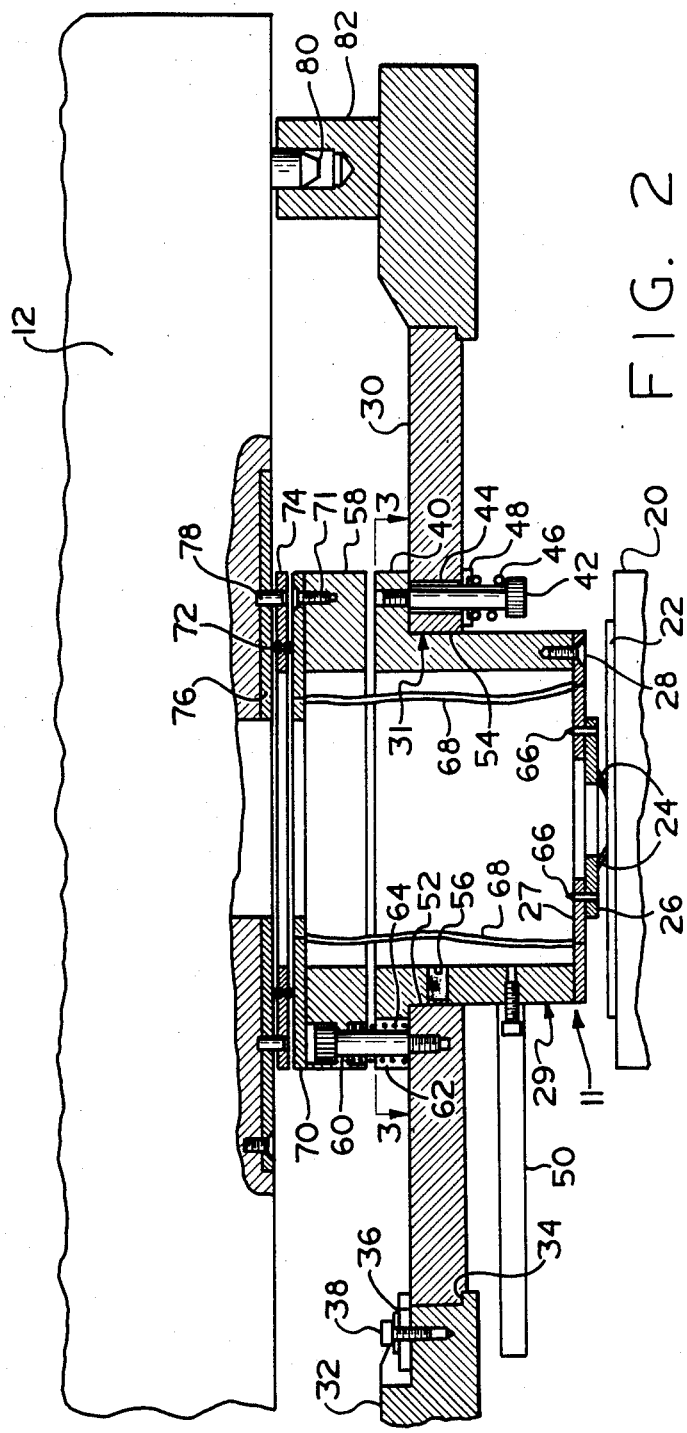
FIG. 2 is a cross-sectional view showing a portion of the prober of FIG. 1; and, FIG. 3 is a sectional view taken along line 3—3 of FIG. 2.

Referring specifically to FIGS. 2 and 3, a chuck 20 is mounted on an X, Y and O stage (not shown) which positions the semiconductor wafer 22 in relation to the probes 24 which contact each die for testing. The probes are mounted on a probe card 26 which is physically and electrically attached to a lower interface board 27. The interface board is attached by means of screws 28 to the mounting sleeve 29 of the interface assembly 11, which is mounted for limited movement relative to the frame of the prober 16 as will be described in more detail herein.

The mounting sleeve 29 is a cylindrical member received in an opening 31 formed through a load plate 30 which is clamped to an annular platform 32, the platform being a part of the frame structure of the prober. In the embodiment illustrated the load plate is received on an inwardly extending ledge 34 formed on the platform, and clamping is by means of a plurality of washers 36 retained by screws 38 threaded into the platform.

The mounting sleeve 29 is formed with a flange portion 40 which supports the sleeve on the load plate 30. The sleeve is attached to the load plate by means of spring-loaded shoulder screws 42 which are received through tangential clearance slots 44 formed through the load plate, and threaded into the flange 40. The slot 44 permits ±5° rotation of the sleeve to provide manual postioning of the probes relative to the wafer. To permit rotation for adjustment purposes while preventing unwanted movement during operation, a spring 46 is received between the head of screw 42 and a washer 48 received against the bottom of the load plate, and, a spring loaded plunger 56 is received in the wall of the sleeve 29 and bears against the opening 31. When the shoulder of screw 42 is received against the flange 40, the spring 46 applies a predetermined drag force resisting axial movement between the sleeve and the load plate. When the spring loaded plunger 56 bears against a first portion 52 of the opening 31, the spring loaded plunger forces the sleeve 29 against a second portion 54 of the opening, opposite the first portion, to take up backlash between the sleeve and the load plate 30. Adjustment of the sleeve is effected by means of a control lever 50 attached to the sleeve.

In accordance with the invention, the interface assembly 11 includes a cylindrical support plate 58 which is spring loaded with respect to the sleeve 29. As shown in FIGS. 2 and 3, three shoulder screws 60 are received in counterbores formed in the support plate and are threaded into the load plate 30. The screws extend through clearance slots 62 formed through the flange 40, and springs 64 surround the screws and act between the load plate and the support plate to maintain the support plate a predetermined distance above the upper surface of the sleeve 29 when the apparatus is in an unloaded condition.

The probe card 26 is a form of P.C. board which has a plurality of spring probes 24 attached thereto, each of which is connected to a contact pin 66. The lower interface board 27 is a P.C. board having a plurality of female connectors therein which receive the pins 66, the pins providing the structural connection between the probe card and the board 27, as well as the electrical connection. Each of the connectors is in electrical contact with a pad to which one end of a connecting wire 68 is soldered or otherwise attached.

The opposite end of each connecting wire is attached to a pad formed on an interface board 70 which is attached to the support plate 58 by means of screws 71. The interface board pads are electrically connected to a circular array of contacts (not shown) which are enagageable with the fuzz buttons 72 correspondingly arranged on the contact ring 74.

The contact ring 74 is a commercially available item which includes a plurality of resilient contacts or fuzz buttons 72 as described in the introductory portion of this specification. The ring is attached to the test head load board 76 by means of pins 78 extending from the load board and lightly press-fit into corresponding holes in the contact ring. A plurality of contacts (not shown) are formed on the load board in position to contact the fuzz buttons, and are connected to the test circuitry within the test head 12 in a known manner.

In operation, the manipulator 18 moves the test head 12 into position over the support plate 58, where the test head is aligned with the prober platform 32 by means of a plurality of guide pins 80 fixed to the test head which are received in reamed holes in corresponding guide sockets 82 fixed to the platform 32. The head is initially positioned as shown in FIG. 2, after which the head is lowered until the fuzz buttons 72 are in electrical contact with the load board 76 and the upper interface board 70. The test head is lowered further until it is supported by the guide sockets 82 in a final, docked position, and the springs 64 are compressed a predetermined amount to establish a predetermined compression force on the fuzz buttons which force is substantially uniform across the buttons.

Since the interface assembly is in two pieces, adjustment of the sleeve 29 relative to the chuck 20 does not affect the relative positions of the contacts on the upper interface board 70, the contact ring 74, and the load board 76.

I claim:

1. In a wafer prober which includes a frame and a chuck operable to receive wafers in position to be probed, apparatus for making electrical contact between a test head disposed above said chuck and contact pads formed on a wafer received in said chuck comprising: a substantially cylindrical housing assembly supported on said frame for rotation relative thereto about a vertical axis; a first printed circuit board attached to a horizontal lower surface of said housing assembly, a plurality of electrical connectors formed on said first printed circuit board; a probe card attached to said first printed circuit board, said probe card including a plurality of electrical contacts engageable with the contact pads on said wafer and connected to corresponding ones of said electrical connectors on said first printed circuit board; a second printed circuit board attached to a horizontal upper surface of said housing assembly; a plurality of electrical contacts on said second printed circuit board; and means connecting the electrical connectors on said first printed circuit board with the electrical contacts on said second printed circuit board; the improvement wherein said housing assembly comprises a first cylindrical member supported by said frame, means attaching said first printed ciruit board to said first cylindrical member, a second cylindrical member disposed above said first cylindrical member, means attaching said second printed circuit board to said second cylindrical member, and spring means acting between said first cylindrical member and said second cylindrical member for axially separating said first and second cylindrical members in a predetermined manner, said spring means being effective to apply a predetermined force the force transmitted between said first and second cylindrical members when said second cylindrical member is displaced axially.

2. Apparatus as claimed in claim 1, including positioning means maintaining said second cylindrical member in concentric relation to said first cylindrical member, said positioning means including means permitting limited relative angular movement between said first cylindrical member and said second cylindrical member.

3. Apparatus as claimed in claim 2, in which said positioning means includes a plurality of shaft member received through portions of said first and second cylindrical members, and arcuate slots formed in one of said first and second cylindrical members, said shaft members being received through said slots to provide said limited angular movement.

4. Apparatus as claimed in claim 3, in which said spring means comprises a plurality of compression springs in surrounding relation to said shaft members.

5. Apparatus as claimed in claims 1, 2, 3, or 4 including, in combination, a test head electrically connected to electronic test apparatus and interfacing with the second printed circuit board of said prober, said test head including a plurality of electrical contacts thereon; and a contact ring received between said test head and said second printed circuit engageable with the contacts on said test head and with the contacts on said second printed circuit board, wherein said contacts are engaged with substantially uniform force as predetermined by said spring means.

6. Apparatus as claimed in claim 1, including means applying a clamping force between said first cylindrical member and said frame.

7. Apparatus as claimed in claim 6, in which the means applying said clamping force comprises a plurality of shoulder screws received through said frame and threaded into a flange formed on said first cylindrical member with the shoulders bottomed against the flange, and a plurality of compression springs received over said shoulder screws between the heads thereof and a surface of said frame.

8. Apparatus as claimed in claim 7, including a plurality of arcuate slots formed in said frame through which said shoulder screws are received to provide limited angular movement of said first cylindrical member relative to said frame.

* * * * *